United States Patent
Heiman et al.

(10) Patent No.: US 7,716,565 B2
(45) Date of Patent: May 11, 2010

(54) METHOD AND SYSTEM FOR DECODING VIDEO, VOICE, AND SPEECH DATA USING REDUNDANCY

(75) Inventors: Arie Heiman, Rannana (IL); Arkady Molev-Shteiman, Bney Barak (IL)

(73) Assignee: Broadcom Corporation, Irvine, CA (US)

( * ) Notice: Subject to any disclaimer, the term of this patent is extended or adjusted under 35 U.S.C. 154(b) by 1317 days.

(21) Appl. No.: 11/189,509

(22) Filed: Jul. 26, 2005

(65) Prior Publication Data

US 2006/0050813 A1 Mar. 9, 2006

Related U.S. Application Data

(60) Provisional application No. 60/603,148, filed on Aug. 20, 2004.

(51) Int. Cl.
*H03M 13/03* (2006.01)
(52) U.S. Cl. .................................................. 714/795
(58) Field of Classification Search .......... 714/746, 714/755, 786, 795, 758
See application file for complete search history.

(56) References Cited

U.S. PATENT DOCUMENTS

| | | | |
|---|---|---|---|
| 5,208,816 A | | 5/1993 | Seshadri |
| 5,802,076 A | * | 9/1998 | Weigand et al. ............. 714/747 |
| 5,968,201 A | * | 10/1999 | Shida et al. ................. 714/795 |
| 6,094,465 A | | 7/2000 | Stein et al. |
| 6,609,008 B1 | | 8/2003 | Whang et al. |
| 6,694,474 B2 | * | 2/2004 | Ramprashad et al. ....... 714/755 |
| 6,799,294 B1 | * | 9/2004 | Chung et al. ................ 714/786 |
| 7,218,665 B2 | | 5/2007 | McAlwain |
| 7,487,430 B2 | * | 2/2009 | Kim et al. .................... 714/779 |

FOREIGN PATENT DOCUMENTS

EP 1056212 B1 11/2000

OTHER PUBLICATIONS

Carl Fredrik Leanderson et al., Joint source channel LIST sequence decoding, 2002, IEEE, p. 951-955.*
Chen et al., An integrated error correction and detection system for digital audio broadcasting, Mar. 2000, IEEE, Trans. on Braodcasting, vol. 46, No. 1, p. 68-78.*
Chen, Brian; Sundberg, C.; "An Integrated Error Correction and Detection System for Digital Audio Broadcasting"; IEEE Transactions on Broadcasting; vol. 46, No. 1; Mar. 2000; pp. 68-78; XP011006110.

(Continued)

*Primary Examiner*—Shelly A Chase
(74) *Attorney, Agent, or Firm*—McAndrews, Held & Malloy, Ltd.

(57) ABSTRACT

A method and system for decoding video, voice, and/or speech data using redundancy and physical constraints are presented. Video, voice, and/or speech bit sequences may be decoded in a multilayer process based on a decoding algorithm and at least one physical constraint. For voice applications, the decoding algorithm may be based on the Viterbi algorithm. At least one estimated bit sequence may be selected by performing searches that start from trellis junctions determined during by the decoding algorithm. The estimated bit sequences may be selected based on corresponding redundancy verification parameters. At least one physical constraint test may be performed on the selected estimated bit sequences to select a decoded output bit sequence.

15 Claims, 10 Drawing Sheets

OTHER PUBLICATIONS

Chen, B. et al; "List Viterbi Algorithms for Wireless Systems"; VTC 2000-Spring. 2000 IEEE 51st; Vehicular Technology Conference Proceedings; Tokyo, Japan, May 15-18, 2000; IEEE Vehicular Technology Conference, Ney York, NY: IEEE, US; vol. 2 of 3 Conf 51; May 15, 2000; pp. 1016-1020; XP000968023.

Laneman, J. Nicholas; "Huffman Code Based Error Screening and Channel Code Optimization for Error Concealment in Perceptual Audio Coding (PAC) Algorithms"; IEEE Transactions on Broadcasting; vol. 48, No. 3, Sep. 2002; pp. 193-206; XP011070269.

* cited by examiner

METHOD AND SYSTEM FOR DECODING VIDEO, VOICE, AND SPEECH DATA USING REDUNDANCY

CROSS-REFERENCE TO RELATED APPLICATIONS/INCORPORATION BY REFERENCE

This patent application makes reference to, claims priority to and claims benefit from U.S. Provisional Patent Application Ser. No. 60/603,148 filed on Aug. 20, 2004.

This application also makes reference to U.S. patent application Ser. No. 11/189,634 filed Jul. 26, 2005.

The above stated applications are hereby incorporated herein by reference in their entirety.

FIELD OF THE INVENTION

Certain embodiments of the invention relate to receivers utilized in wired and wireless communication systems. More specifically, certain embodiments of the invention relate to a method and system for decoding video, voice, and/or speech data using redundancy.

BACKGROUND OF THE INVENTION

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, the optimization of a receiver system may be based on whether the signals being received, generally in the form of successive symbols or information bits, are interdependent. Signals received from, for example, a convolutional encoder, may be interdependent signals, that is, signals with memory. In this regard, a convolutional encoder may generate NRZI or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received.

Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

Improvements in the design and implementation of optimized receivers for decoding convolutional encoded data may require modifications to the application of the MLSE algorithm, the Viterbi algorithm, and/or the MAP algorithm in accordance with the modulation method utilized in signal transmission.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for decoding video, voice, and/or speech data using redundancy, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention provide a method and system for decoding video, voice, music and/or speech data using redundancy. Video, speech, music, and/or voice bit sequences may be decoded in a multilayer process based on a decoding algorithm and at least one physical constraint. For voice applications, the decoding algorithm may be based on the Viterbi algorithm. At least one estimated bit sequence may be selected by performing searches that start from trellis junctions determined during decoding by the decoding algorithm. The estimated bit sequences may be selected based on corresponding redundancy verification parameters. At least one physical constraint test may be performed on the selected estimated bit sequences to select a decoded output bit sequence.

Figure 1A:
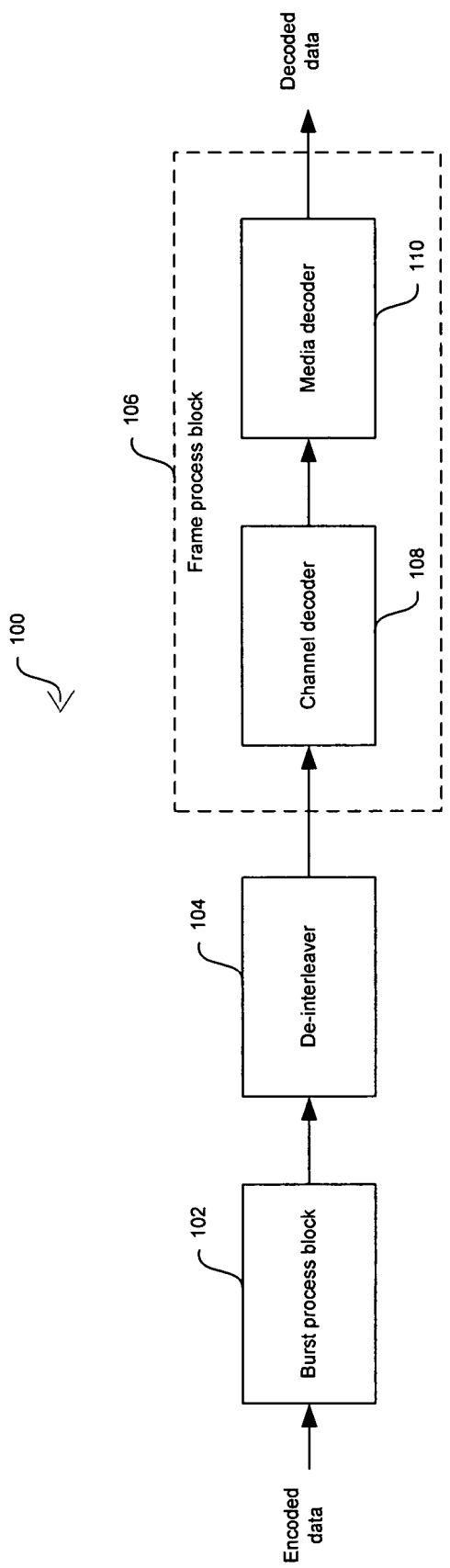
FIG. 1A is a block diagram illustrating a multilayer system for improving decoding, in accordance with an embodiment of the invention.

FIG. 1A is a block diagram illustrating a multilayer system for improving decoding, in accordance with an embodiment of the invention. Referring to FIG. 1, there is shown a receiver 100 that comprises a burst process block 102, a de-interleaver 104, and a frame process block 106. The frame process block 106 may comprise a channel decoder 108 and a media decoder 110. The receiver 100 may comprise suitable logic, circuitry, and/or code that may be adapted to operate as a wired or wireless receiver. The receiver 100 may be adapted to utilize redundancy to decode interdependent signals, for example, signals that comprise convolutional encoded data. The receiver 100 may also be adapted to utilize a multilayer approach for improving the decoding of interdependent signals or signals with memory. In this regard, the receiver 100 may be adapted to perform a burst process and a frame process when processing the received interdependent signals. The multilayer approach performed by the receiver 100 may be compatible with a plurality of modulation standards.

The burst process block 102 may comprise suitable logic, circuitry, and/or code that may be adapted to perform the burst process portion of the decoding operation of the receiver 100. The burst process block 102 may comprise, for example, a channel estimation operation and a channel equalization operation. Results from the channel estimation operation may be utilized by the channel equalization operation to generate a plurality of data bursts based on a maximum-likelihood sequence estimation (MLSE) operation. The output of the burst process block 102 may be transferred to the de-interleaver 104. The de-interleaver 104 may comprise suitable logic, circuitry, and/or code that may be adapted to multiplex bits from a plurality of data bursts received from the burst process block 102 to form the frame inputs to the frame process block 106. Interleaving may be utilized to reduce the effect of channel fading distortion, for example.

The channel decoder 108 may comprise suitable logic, circuitry, and/or code that may be adapted to decode the bit sequences in the input frames received from the de-interleaver 104. The channel decoder 108 may be adapted to utilize the Viterbi algorithm during a Viterbi operation to improve the decoding of the input frames. The media decoder 110 may comprise suitable logic, circuitry, and/or code that may be adapted to perform content specific processing operations on the results of the channel decoder 108 for specified applications such as MPEG-4, enhanced full-rate (EFR) or adaptive multi-rate (AMR) speech coder used in global system for mobile (GSM) communications, and/or MP3, for example.

Regarding the frame process operation of the receiver 100, a standard approach for decoding convolution encoded data is to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process by the signals source. This inherent redundancy may be utilized in the decoding process by developing a MLSE algorithm that may be adapted to meet at least some of the physical constrains of the signals source. The use of physical constraints in the MLSE may be expressed as finding a maximum of the conditional probability P(X/R), where the sequence X meets a set of physical constrains C(X) and the set of physical constrains C(x) may depend on the source type and on the application. In this regard, the source type may be a voice, music and/or a video source type.

For example, for speech applications, physical constraints may include gain continuity and smoothness in inter-frames or intra-frames, pitch continuity in voice inter-frames or intra-frames, and/or consistency of line spectral frequency (LSF) parameters that are utilized to represent a spectral envelope.

Figure 1B:
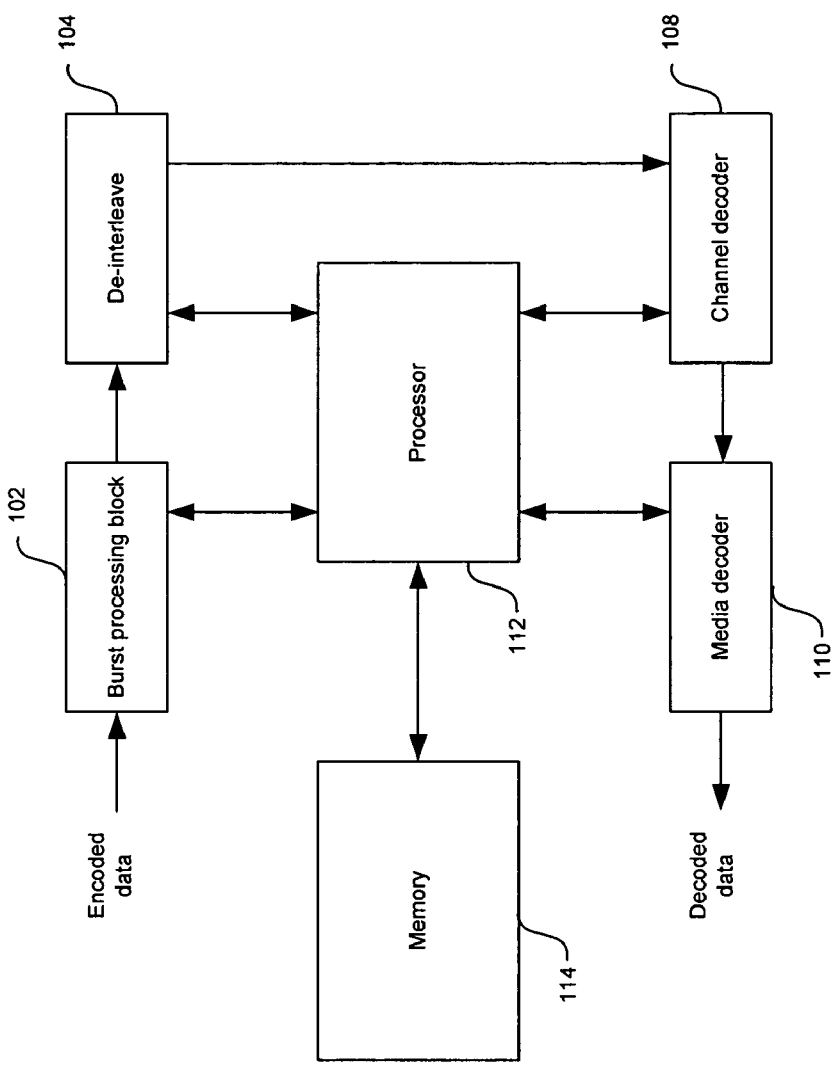
FIG. 1B is a block diagram illustrating a multilayer system with a processor and memory for improving decoding, in accordance with an embodiment of the invention.

FIG. 1B is a block diagram illustrating a multilayer system with a processor and memory for improving decoding, in accordance with an embodiment of the invention. Referring to FIG. 1B, there is shown a processor 112, a memory 114, the burst process block 102, a de-interleaver 104, the channel decoder 108 and the media decoder 110. The processor 112 may comprise suitable logic, circuitry, and/or code that may be adapted to perform computations and/or management operations. The processor 112 may also be adapted to communicate and/or control at least a portion of the operations of the burst process block 102, the de-interleaver 104, the channel decoder 108 and the media decoder 110. The memory 114 may comprise suitable logic, circuitry, and/or code that may be adapted to store data and/or control information. The memory 114 may be adapted to store information that may be utilized and/or that may be generated by the burst process block 102, the de-interleaver 104, the channel decoder 108 and the media decoder 110. In this regard, information may be transferred to and from the memory 114 via the processor 112, for example.

Figure 2:
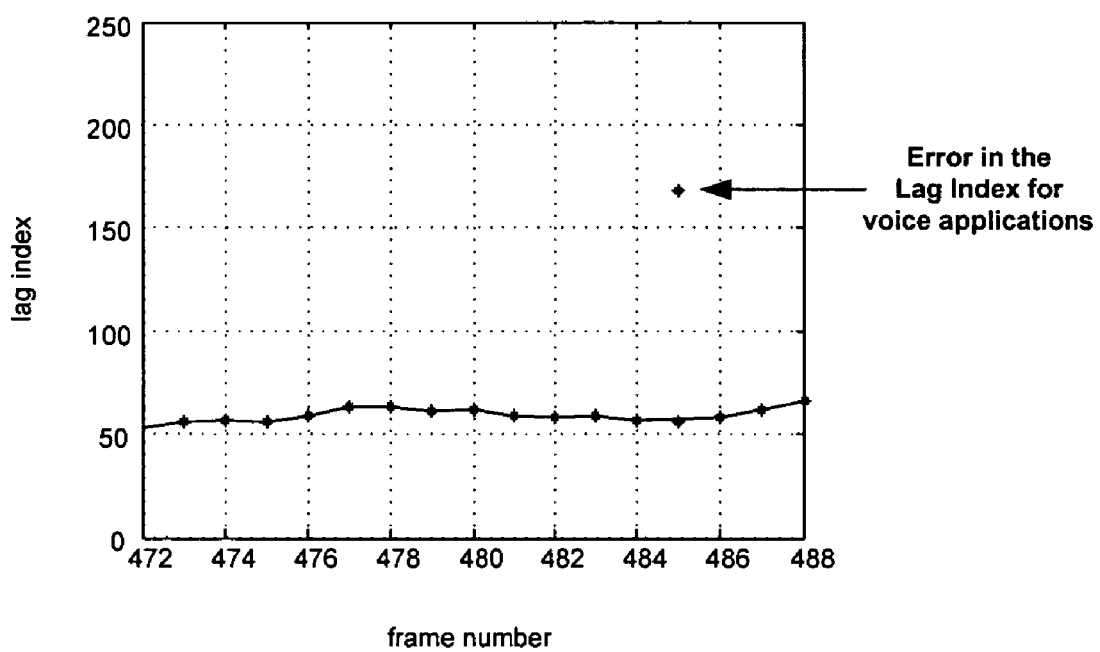
FIG. 2 is a diagram illustrating irregularity in pitch continuity voice frames, which may be utilized in association with an embodiment of the invention.

FIG. 2 is a diagram illustrating irregularity in pitch continuity in voice frames, which may be utilized in association with an embodiment of the invention. Referring to FIG. 2, there is shown a lag index or pitch continuity as a function of frame number with a non-physical pitch in frame 485 due to bit error. In instances where the lag index may comprise a continuity that results from physical constraints in speech, applying a physical constraint to the decoding operation of the lag index may reduce decoding errors.

For certain data formats, for example, the inherent redundancy of the physical constraints may result from the packaging of the data and the generation of a redundancy verification parameter, such as a cyclic redundancy check (CRC), for the packaged data. Moreover, decoding data generated by entropy encoders or variable length coding (VLC) operations may also meet some internal constraints. For example, VLC operations utilize a statistical coding technique where short codewords may be utilized to represent values that occur frequently and long codewords may be utilized to represent values that occur less frequently.

In video applications, where the video information may be partitioned into frames, blocks, and/or macroblocks, typical constraints may include, for example, continuity between the borders of discrete cosine transform (DCT) blocks, continuity of the DC component between neighboring blocks, continuity of low frequencies between blocks, and/or consistency of data that is coded by a VLC operation.

Figure 3:
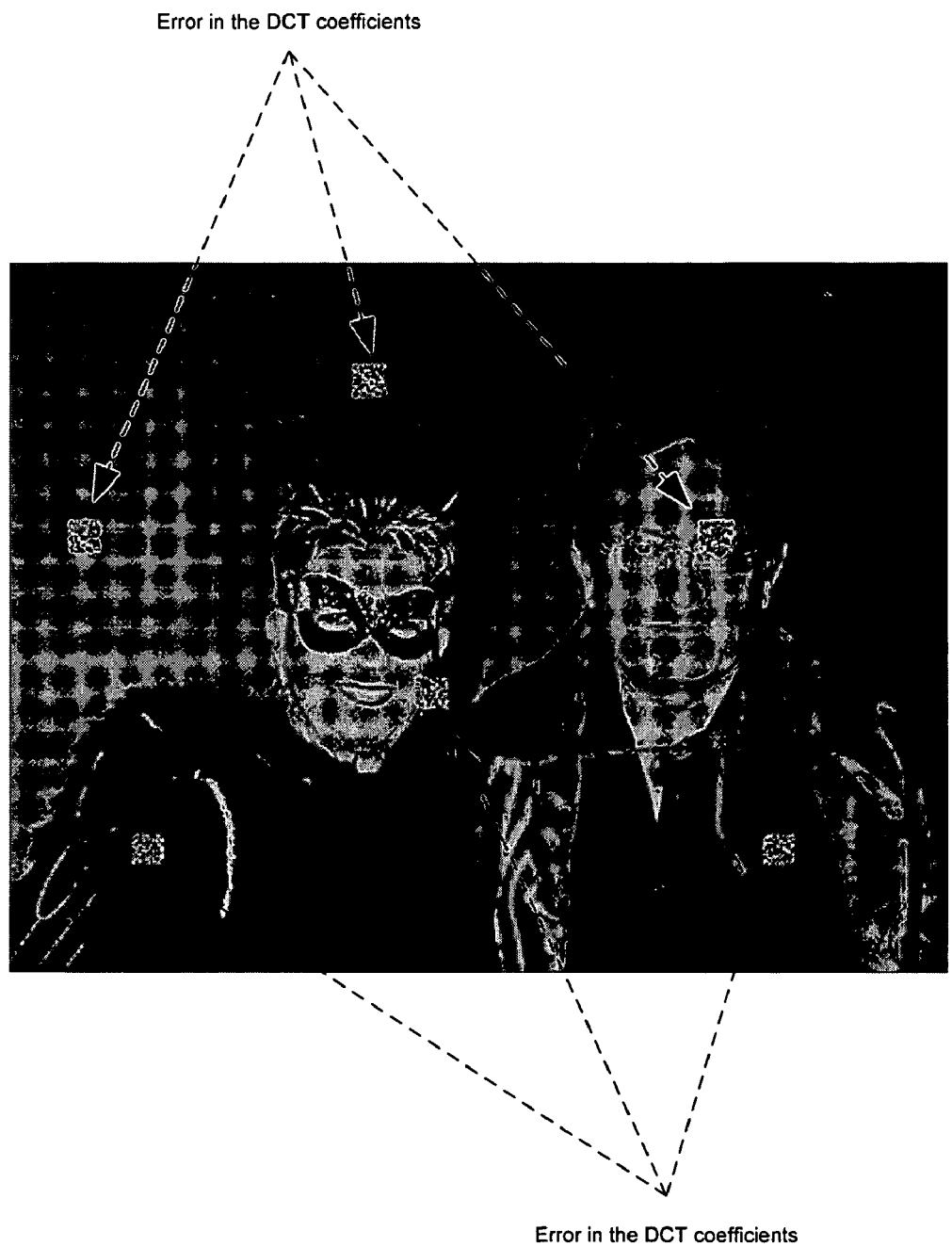
FIG. 3 is a diagram illustrating the effects on an image of errors in the decoding of DCT coefficients, which may be utilized in association with an embodiment of the invention.

FIG. 3 is a diagram illustrating the effects on an image of errors in the decoding of DCT coefficients, which may be utilized in association with an embodiment of the invention. Referring to FIG. 3, there is shown a plurality of errors that may occur in a reconstructed image when there is an error in decoding the DCT coefficients that may be utilized to inverse transform the image in a video decoder. In this regard, applying a physical constraint to the decoding operation of the DCT coefficients may reduce decoding errors.

In voice transmission applications, such as AMR or EFR in GSM, the physical constraints may be similar to those utilized in general speech applications. Physical constraints in GSM applications may comprise gain continuity and smoothness in inter-frames or intra-frames, pitch continuity in voice inter-frames or intra-frames, continuity of line spectral frequency (LSF) parameters and format locations that are utilized to represent speech. Moreover, GSM applications may utilize redundancy, such as in CRC, as a physical constraint. For example, in GSM applications, EFR coding may utilize 8 and 3 bits for CRC, AMR coding may utilize 6 bits for CRC, and GSM half-rate (GSM-HR) coding may utilize 3 bits for CRC. In WCDMA applications, adaptive multi-rate (AMR) coding may utilize 12 bits for CRC, for example.

Regarding the frame process operation of the receiver 100, another approach for decoding convolutional encoded data is to utilize a maximum a posteriori probability (MAP) algorithm. This approach may utilize a priori statistics of the source bits such that a one-dimensional a priori probability, $p(b_i)$, may be generated, where $b_i$ corresponds to a current bit in the bit sequence to be encoded. To determine the MAP sequence, the Viterbi transition matrix calculation may need to be modified. This approach may be difficult to implement in instances where the physical constraints are complicated and when the correlation between bits $b_i$ and $b_j$, where i and j are far apart, may not be easily determined. In cases where a parameter domain has a high correlation, the MAP algorithm may be difficult to implement. Moreover, the MAP algorithm may not be utilized in cases where inherent redundancy, such as for CRC, is part of the physical constraints.

The maximum-likelihood sequence estimate (MLSE) for a bit sequence may be a preferred approach for decoding convolutional encoded data. A general solution for the maximum of the conditional probability $P(X/R)$, where R meets a certain set of physical constraints $C(X)$, for the MLSE may still be difficult to implement. In this regard, an efficient solution may require a suboptimal solution that takes into consideration complexity and implementation of the physical constraints. The following example illustrates the application of a multilayer solution that efficiently implements physical constraints into the decoding of voice data in GSM applications.

Figure 4A:
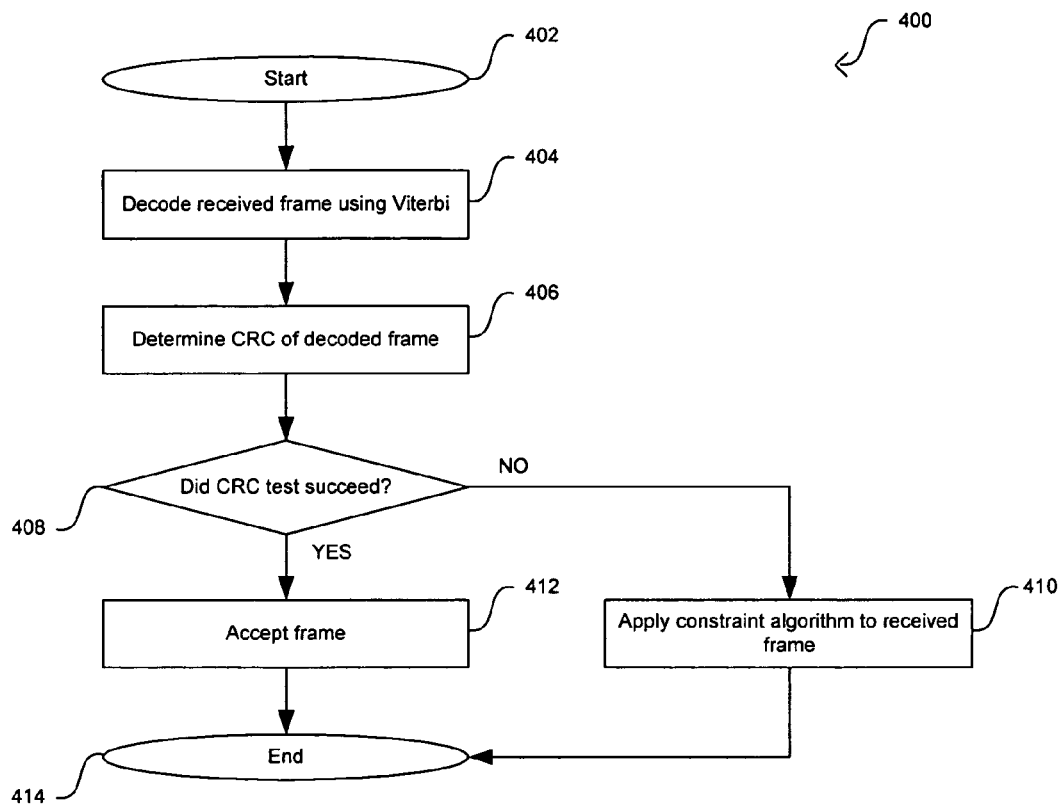
FIG. 4A is a flow diagram illustrating exemplary steps in the application of redundancy to a multilayer process, in accordance with an embodiment of the invention.

FIG. 4A is a flow diagram illustrating exemplary steps in the application of redundancy to a multilayer process, in accordance with an embodiment of the invention. Referring to FIG. 4A, after start step 402, in step 404, the receiver 100 in FIG. 1A may decode a received frame in the frame process block 106 by utilizing the Viterbi algorithm. In step 406, a redundancy verification parameter, such as the CRC, may be determined for the decoded frame. In step 408, the receiver 100 may determine whether the CRC verification test was successful. When the CRC verifies the decoded frame, the receiver 100 may proceed to step 412 where the decoded frame is accepted. After step 412, the receiver 100 may proceed to end step 414.

Returning to step 408, when the CRC verification test is not successful for the decoded frame, the receiver 100 may proceed to step 410. In step 410, the receiver 100 may perform a redundancy algorithm that may be utilized to provide a decoding performance that may result in equal or reduced decoding errors than those that may occur from utilizing the standard Viterbi algorithm. After step 410, the receiver 100 may proceed to end step 414.

For GSM applications, for example, the redundancy algorithm may comprise searching for the MLSE that may also meet the CRC condition and the speech constraints. In this regard, a set of k bit sequences {S1, S2, ... , Sk} may be determined from the MLSE that meet the CRC constraint. Once the set of k sequences is determined, a best sequence, Sb, may be determined that also meets the GSM voice or speech constraints.

Figure 4B:
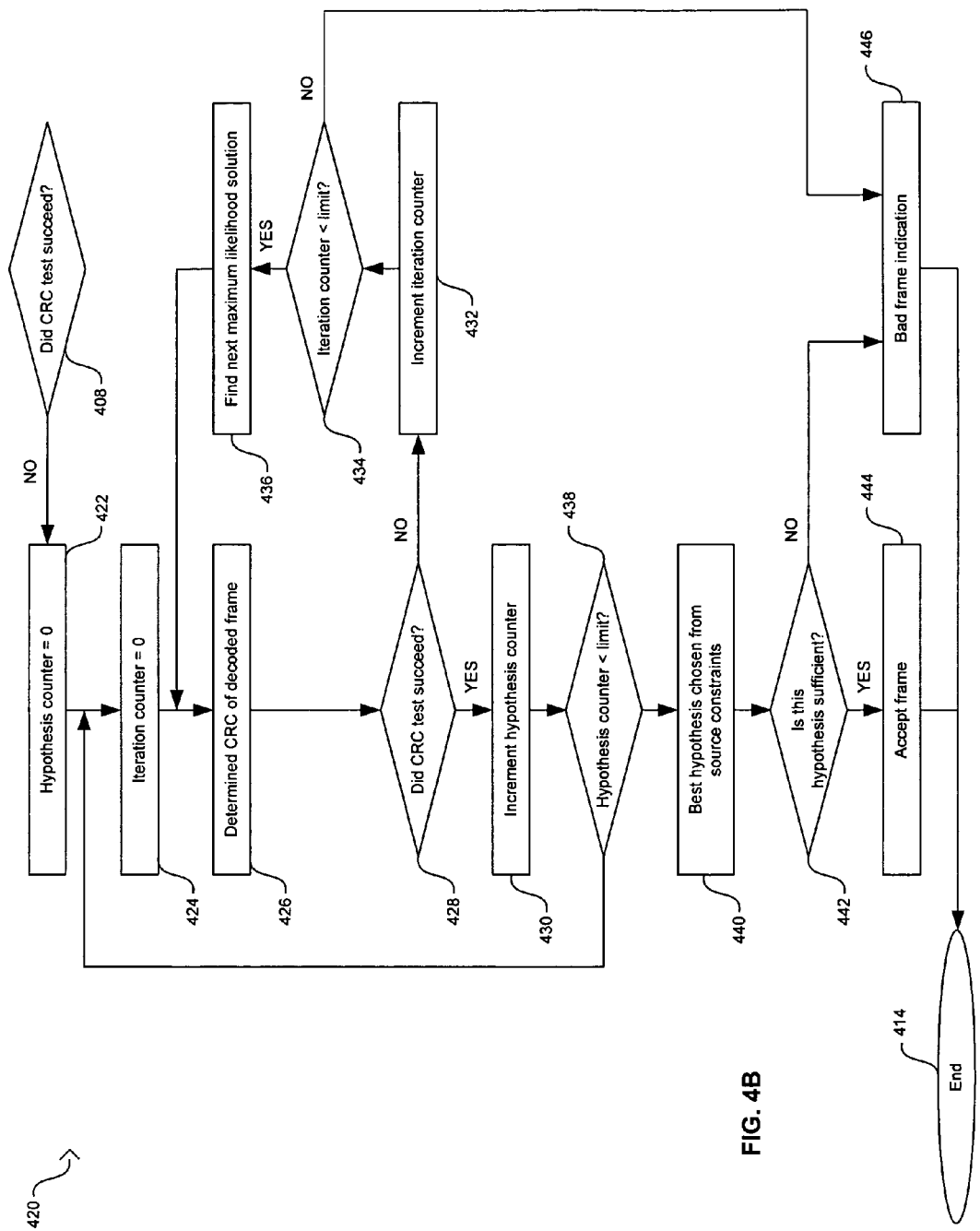
FIG. 4B is a flow diagram illustrating exemplary steps in the application of a constraint algorithm to a received frame, in accordance with an embodiment of the invention.

FIG. 4B is a flow diagram illustrating exemplary steps in the application of a constraint algorithm to a received frame, in accordance with an embodiment of the invention. Referring to FIG. 4B, when the CRC verification test is not successful for the decoded frame in step 408 in FIG. 4A, the receiver 100 in FIG. 1A may proceed to step 422. In step 422, a hypothesis counter may be set to an initial counter value to indicate a first hypothesis for consideration, for example. The initial counter value in step 422 may be zero, for example. After step 422, an iteration counter may be set to an initial counter value in step 424 to indicate a first maximum likelihood solution, for example. The initial counter value in step 424 may be zero, for example. In step 426, the CRC of the decoded frame may be determined.

In step 428, the receiver 100 may determine whether the CRC verification test was successful for the current hypothesis. When the CRC verification test is not successful, the operation may proceed to step 432. In step 432, the iteration counter may be incremented. After step 432, in step 434, the receiver 100 may determine whether the iteration counter is less than a predetermined limit. When the iteration counter is higher or equal to the predetermined limit, the operation may proceed to step 446 where a bad frame indication is generated. When the iteration counter is less than the predetermined limit, the operation may proceed to step 436 where a next maximum likelihood solution may be determined. After step 436, the operation may proceed to step 426 where the CRC of the decoded frame may be determined based on the maximum likelihood solution determined in step 426.

Returning to step 428, when the CRC verification test is successful, the operation may proceed to step 430. In step 430, the hypothesis counter may be incremented. After step 430, in step 438, the receiver 100 may determine whether the hypothesis counter is less than a predetermined limit. When the hypothesis counter is lower than the predetermined limit, the operation may proceed to step 424 where the iteration counter may be set to an initial value. When the hypothesis counter is equal to the predetermined limit, the operation may proceed to step 440 where the best hypothesis may be chosen from the source constraints.

After step 440, in step 442, the receiver 100 may determine whether the best hypothesis chosen in step 440 is sufficient to accept the decoded frame. When the chosen hypothesis is sufficient to accept the decoded frame, the operation may proceed to step 444 where the decoded frame may be accepted. When the chosen hypothesis is not sufficient to accept the decoded frame, the operation may proceed to step 446 where a bad frame indication is generated. After step 444 or step 446, the operation may proceed to end step 414 in FIG. 4A.

Figure 5A:
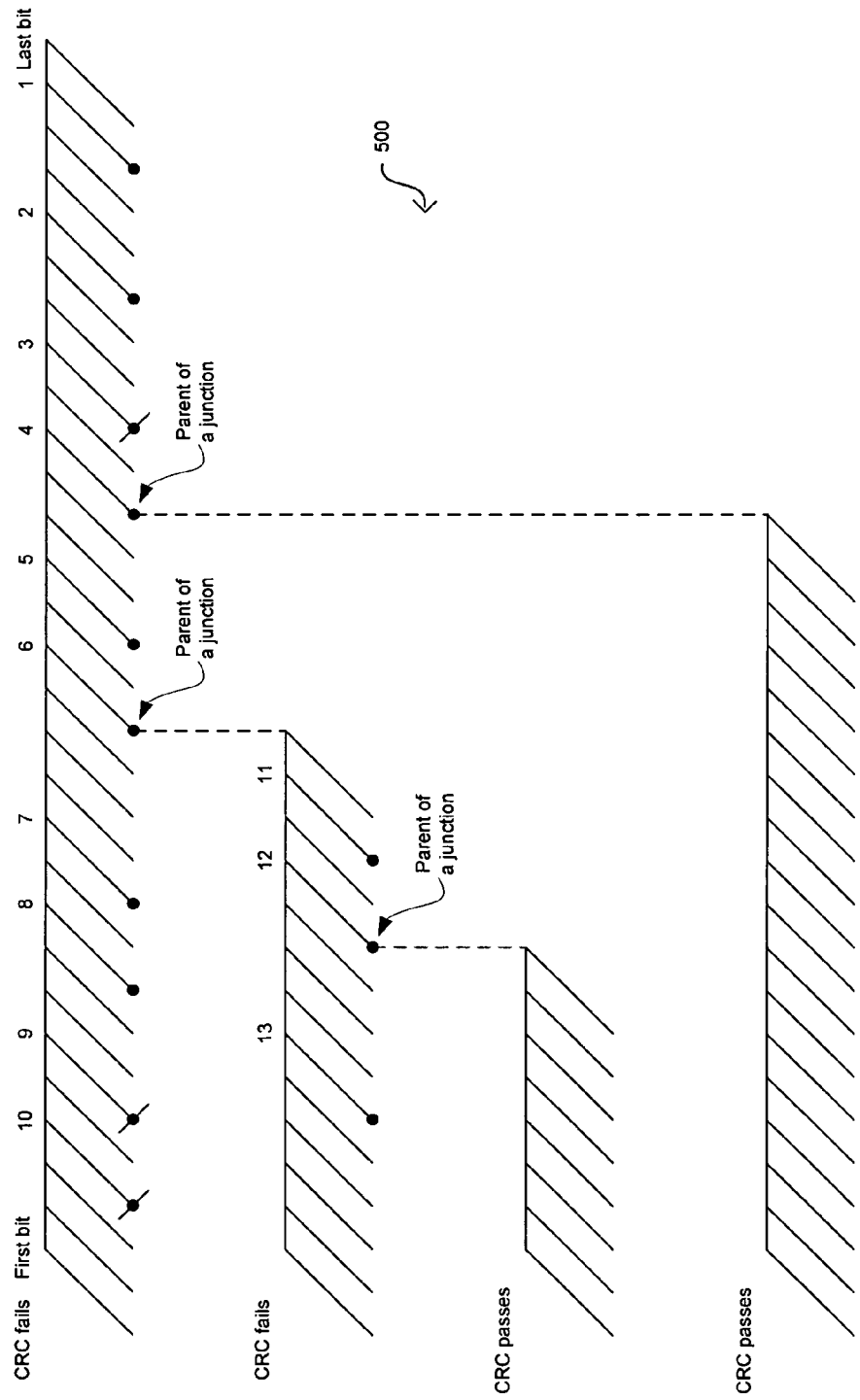
FIG. 5A is diagram illustrating an exemplary search process for a T hypothesis that meets CRC constraint, in accordance with an embodiment of the invention.

FIG. 5A is diagram illustrating an exemplary search process for a T hypothesis that meets CRC constraint, in accordance with an embodiment of the invention. Referring to FIG. 5A, the search tree 500 may correspond to an exemplary sequence search process that may start with the reduced set of estimated bit sequences generated by a Viterbi operation. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the CRC constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the CRC or redundancy verification parameter for GSM may start with the selected trellis junction with the highest metric. In this example, the junction labeled 6 has the highest metric and the search process may start at that point. A new search tree 500 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for CRC. As shown, the CRC fails for this new branch and a next branch may be created from the junction with the highest metric or junction 12 as shown. In this instance, the branch that results from junction 12 meets the CRC constraint and the search process may return to the top row and to the junction with the next highest metric. The estimated bit sequence associated with junction 12 may be elected as one of the bit sequences for the set of k sequences {S1, S2, . . . , Sk}.

Junction 4 represents the next highest metric after junction 6 on the top row and a new branch or row may be created from junction 4. In this instance, the new branch meets the CRC constraint and the estimated bit sequence associated with junction 4 may be selected as one of the bit sequences for the set of k sequences {S1, S2, . . . , Sk}. This approach may be followed until the limit of k sequences is exceeded or the search from all the remaining selected junctions is performed. In this regard, a plurality of trace back pointers may be calculated during the search operation. The size of the set of k sequences {S1, S2, . . . , Sk} may vary.

Figure 5B:
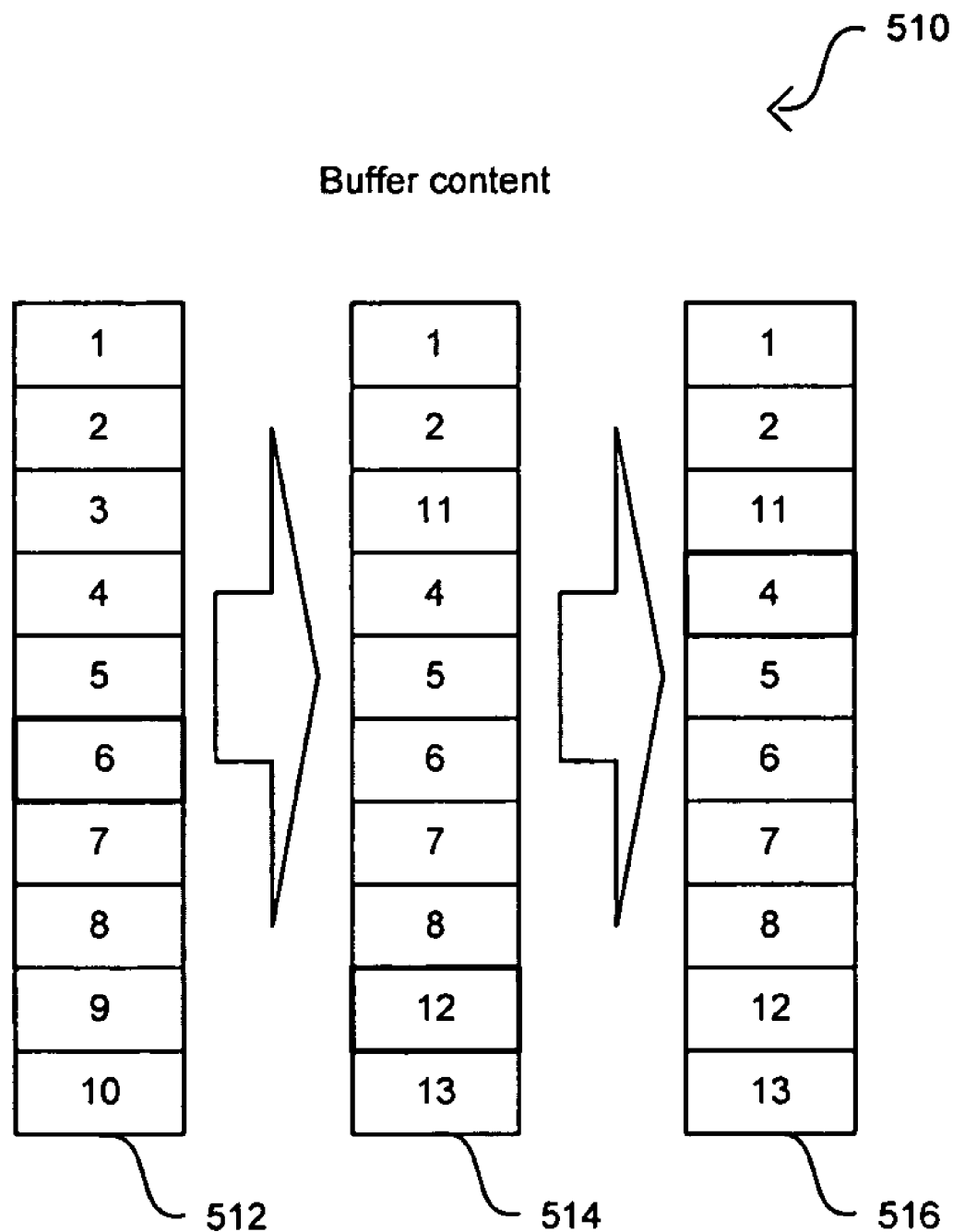
FIG. 5B is a diagram illustrating exemplary buffer content during the search process described in FIG. 5A, in accordance with an embodiment of the invention.

FIG. 5B is a diagram illustrating exemplary buffer content during the search process described in FIG. 5A, in accordance with an embodiment of the invention. Referring to FIG. 5B, there is shown a buffer content 510 that may correspond to the junction labels under consideration during the search process. For example, state 512 may correspond to the initial 10 junctions in the search operation. In this regard, junction 6 is highlighted to indicate that it corresponds to the highest metric value and is the starting point of a new branch or row. Step 514 may correspond to the next set of 10 junctions. In this instance, junctions 3, 9, and 10 have been replaced with junctions 11, 12, and 13 that resulted from the branch created from junction 6. Junction 12 is highlighted to indicate that is corresponds to the highest metric value and is the starting point of a new branch or row. State 516 may correspond to the next set of 10 junctions. In this instance, junction 4 is highlighted to indicate that is corresponds to the highest metric value and is the starting point of a new branch or row. Trace back pointers may be calculated at each state to track the search process.

Figure 5C:
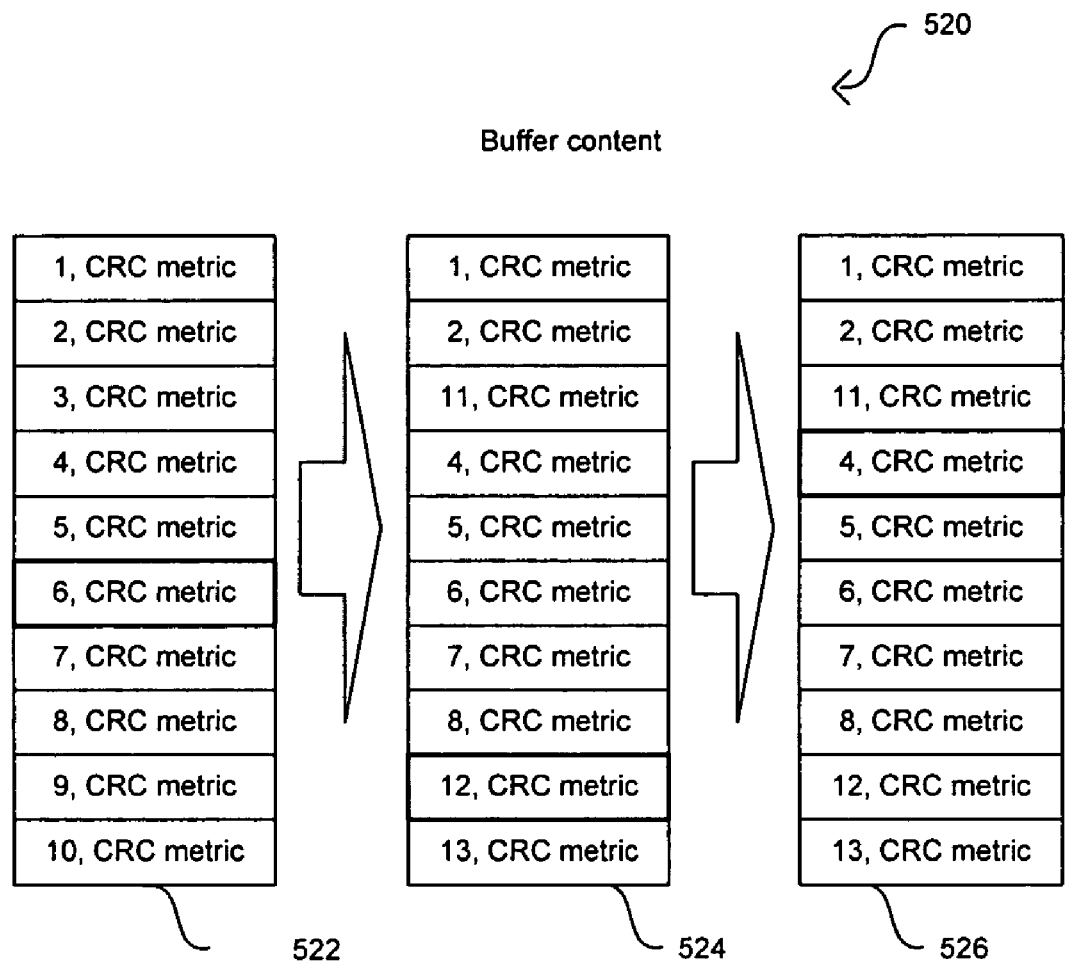
FIG. 5C is a diagram illustrating exemplary buffer content when CRC and trace back pointers are calculated simultaneously during the search process described in FIG. 5A, in accordance with an embodiment of the invention.

FIG. 5C is a diagram illustrating exemplary buffer content when CRC and trace back pointers are calculated simultaneously during the search process described in FIG. 5A, in accordance with an embodiment of the invention. Referring to FIG. 5C, there is shown a buffer content 520 that may correspond to the junction labels under consideration during the search process and the corresponding CRC calculations. As with FIG. 5B, the buffer content 520 may vary its contents based on a current state. For state 522, state 524, and state 526, the contents that correspond to the current junctions under consideration are the same as in state 512, state 514, and state 516 in FIG. 5B respectively. However, in order to simplify the search process for T hypothesis, the CRC and the trace back pointers for the states may be calculated simultaneously. This approach is possible because the CRC may be calculated as sum($b_i R_i$), where $R_i$ is the remainder of $xi/g(x)$, $g(x)$ is the generator polynomial of the CRC, and $b_i$ is the value of the bit i. The CRC metric of each sequence may be kept or stored in the buffer content 520. The CRC metric may be obtained as the sum of the biRi values from the junction to the last bit, and may also be determined as the sum of the parent sequence CRC metric and sum of the biRi values from junction to its parent. The sequence may meet the CRC condition if the CRC metric is equal to the sum of the biRi values from first bit to the junction. The values for $R_i$ may be stored in, for example, a look up table.

Once the set of k sequences {S1, S2, . . . , Sk} has been determined by following the search process as described in FIGS. 5A-5C, the redundancy algorithm may require that the receiver 100 in FIG. 1 selects one of the bit sequences as the best bit sequence, Sb, where Sb corresponds to the bit sequence that meets the CRC constrain and the physical constrains with the highest level of confidentiality. The best bit sequence may also be referred to as the decoded output bit sequence of the multilayer process.

For each of the candidate bit sequences in the set of k sequences {S1, S2, . . . , Sk}, a set of T1 different physical constraint tests, {Test(j), . . . , Test(T1)}, may be performed. The physical constraint tests correspond to tests of quantifiable characteristics of the type of data received for a particular application. The scores of the physical constraint tests for an $i^{th}$ bit sequence, {T_SC(i, j), . . . , T_SC(i, T1)}, may be utilized to determine whether the bit sequence passed or failed a particular test. For example, when T_SC(i, j)>0, the $i^{th}$ bit sequence is said to have failed the $j^{th}$ physical constraint test. When the T_SC(i, j)<=0, the $i^{th}$ bit sequence is said to have passed the $j^{th}$ physical constraint test. In some instances, when the value of a test score is smaller, the reliability of the score may be increased.

Once the physical constraint tests are applied to the candidate estimated bit sequences, the following exemplary approach may be followed: when a score is positive, the candidate bit sequence may be rejected; for a particular physical constraint test, the candidate with the best score or with the lowest score value may be found; the candidate that is selected as the best score for the most number of tests may be selected as the best bit sequence, Sb.

Table 1 illustrates an exemplary embodiment of the invention in which a set of five candidate bit sequences, {S1, S2, S3, S4, and S5}, may be tested using a set of four physical constraint tests, {Test(1), Test(2), Test(3), and Test(4)}. The scores may be tabulated to identify passing and failing of various tests for each of the candidate bit sequences. In this instance, S2 and S4 are rejected for having positive scores for Test(2) and Test(4) respectively. The bit sequence S3 is shown to have the lowest score in Test(1), Test(3), and Test(4) and may be selected as the best bit sequence, Sb.

TABLE 1

| Candidate | Test (1) | Test (2) | Test (3) | Test (4) |
|---|---|---|---|---|
| S1 | Score(1, 1) < 0 | Score(1, 2) < 0 | Score(1, 3) < 0 | Score(1, 4) < 0 |
| S2 | Score(2, 1) < 0 | Score(2, 2) > 0 | Score(2, 3) < 0 | Score(2, 4) < 0 |
| S3 | Score(3, 1) < 0 | Score(3, 2) < 0 | Score(3, 3) < 0 | Score(3, 4) < 0 |
| S4 | Score(4, 1) < 0 | Score(4, 2) < 0 | Score(4, 3) < 0 | Score(4, 4) > 0 |
| S5 | Score(5, 1) < 0 | Score(5, 2) < 0 | Score(5, 3) < 0 | Score(5, 4) < 0 |
| Bit sequence with minimum score | S3 | S5 | S3 | S3 |

Some characteristic physical constraint tests that may be utilized by, for example, adaptive multi-rate (AMR) coding are LSF parameters, gain, and/or pitch. For the LSF parameters, some of the tests may be based on the distance between two formants, changes in consecutive LSF frames or sub-frames, and the effect of channel metrics on the thresholds. For example, the smaller the channel metric, the more difficult it is to meet the threshold. Regarding the use of gain as a physical constraint test, the criteria may be smoothness or consistency between consecutive frames or sub-frames. Regarding pitch, the criteria may be the difference in pitch between frames or sub frames.

Figure 6:
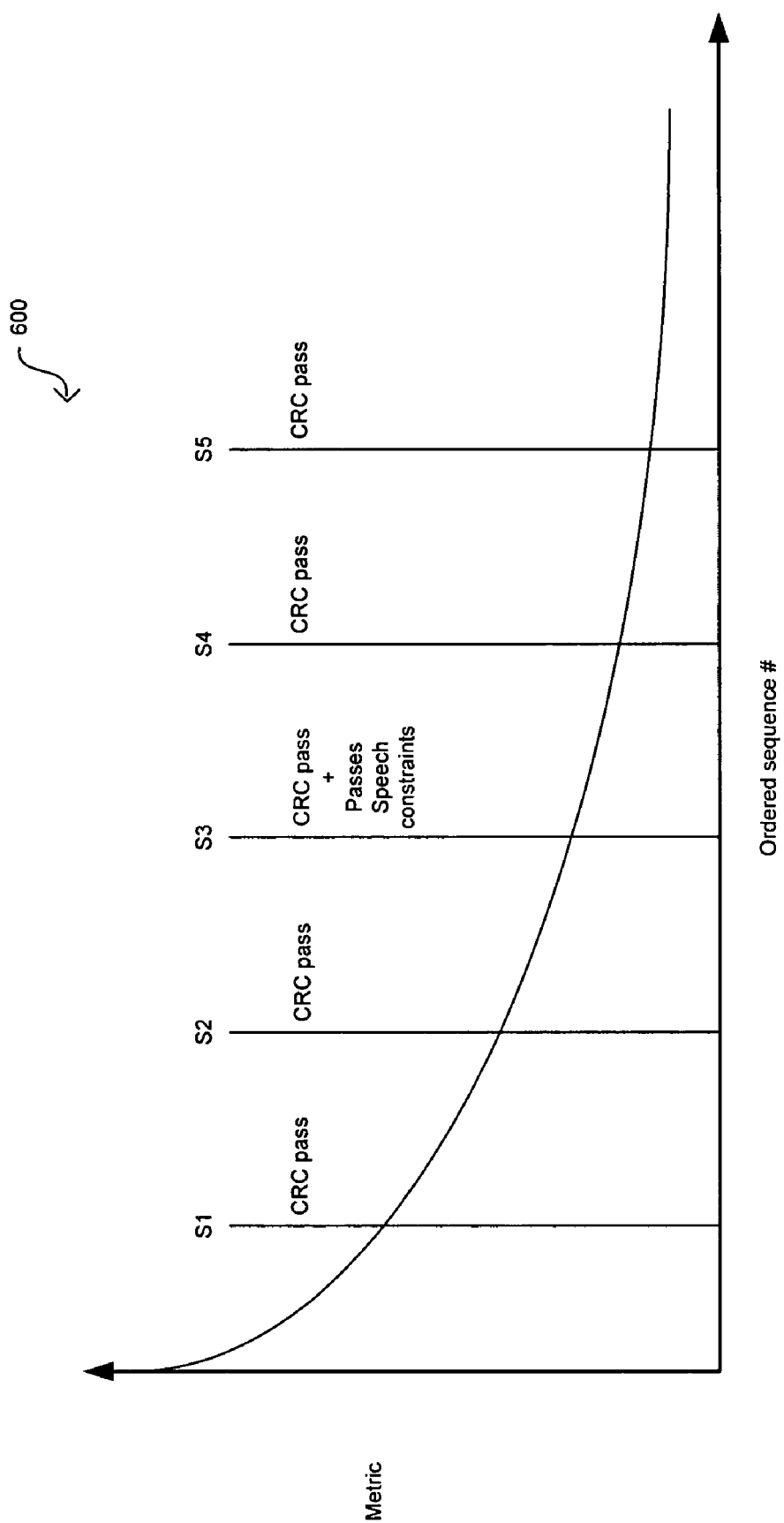
FIG. 6 is a graph illustrating exemplary set of sequences that meets CRC and speech constraints, in accordance with an embodiment of the invention.

FIG. 6 is a graph illustrating exemplary set of sequences that meets CRC and speech constraints, in accordance with an embodiment of the invention. Referring to FIG. 6, there is shown the result of the redundancy algorithm. For example, the search process for T hypothesis as shown in FIGS. 5A-5C may result in the set of bit sequences {S1, S2, S3, S4, and S5}. These bit sequences were selected based on their metric values and passing the CRC verification. The set of bit sequences were also required to pass physical constraint tests as described herein. In this instance, the bit sequence S3 has been shown to meet the CRC verification and the physical constraint test and may be selected as the best bit sequence, Sb.

The approach described herein may result in fewer decoding bit errors than may occur with the standard Viterbi algorithm. The use of redundancy information may be efficiently implementation in the design of optimized receivers for decoding convolutional encoded data by adding at least one physical constraint to a portion of the results that may be achieved by the Viterbi algorithm.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
performing by one or more circuits and/or processors:
generating a corresponding redundancy verification parameter for a received bit sequence that is decoded using a decoding algorithm, wherein said decoding algorithm comprises a Viterbi algorithm;
selecting at least one trellis junction generated by said Viterbi algorithm;
verifying said decoded received bit sequence based on said corresponding redundancy verification parameter; and
if said decoded received bit sequence fails said verification, decoding said received bit sequence by imposing at least one physical constraint during decoding by said decoding algorithm, wherein said physical constraint is related to the type of data for said received bit sequence.

2. The method according to claim 1, comprising selecting at least one estimated bit sequence by performing a search starting from each of said selected at least one trellis junction, wherein said at least one estimated bit sequence is selected when verified by a corresponding redundancy verification parameter.

3. The method according to claim 2, comprising simultaneously generating said corresponding redundancy verification parameter for each of said selected at least one estimated bit sequence and at least one trace back pointer used for performing said search starting from each of said selected at least one trellis junction.

4. The method according to claim 2, comprising performing at least one physical constraint test on said selected at least one estimated bit sequence.

5. The method according to claim 4, comprising selecting one of said selected at least one estimated bit sequence as a decoded output bit sequence based on said performed at least one physical constraint test.

6. A computer readable medium having stored thereon, a computer program having at least one code section for signal processing, the at least one code section being executable by a computer for causing the computer to perform steps comprising:

generating a corresponding redundancy verification parameter for a received bit sequence that is decoded using a decoding algorithm, wherein said decoding algorithm comprises a Viterbi algorithm;

selecting at least one trellis junction generated by said Viterbi algorithm;

verifying said decoded received bit sequence based on said corresponding redundancy verification parameter; and if said decoded received bit sequence fails said verification, decoding said received bit sequence by imposing at least one physical constraint during decoding by said decoding algorithm, wherein said physical constraint is related to the type of data for said received bit sequence.

7. The computer readable medium according to claim 6, wherein said at least one code section comprises code for selecting at least one estimated bit sequence by performing a search starting from each of said selected at least one trellis junction, wherein said at least one estimated bit sequence is selected when verified by a corresponding redundancy verification parameter.

8. The computer readable medium according to claim 7, wherein said at least one code section comprises code for simultaneously generating said corresponding redundancy verification parameter for each of said selected at least one estimated bit sequence and at least one trace back pointer used for performing said search starting from each of said selected at least one trellis junction.

9. The computer readable medium according to claim 7, wherein said at least one code section comprises code for performing at least one physical constraint test on said selected at least one estimated bit sequence.

10. The computer readable medium according to claim 9, wherein said at least one code section comprises code for selecting one of said selected at least one estimated bit sequence as a decoded output bit sequence based on said performed at least one physical constraint test.

11. A system for signal processing, the system comprising:

at least one processor that is operable to generate a corresponding redundancy verification parameter for a received bit sequence that is decoded using a decoding algorithm, wherein said decoding algorithm comprises a Viterbi algorithm;

said at least one processor is operable to select at least one trellis junction generated by said Viterbi algorithm;

said at least one processor is operable to verify said decoded received bit sequence based on said corresponding redundancy verification parameter; and if said decoded received bit sequence fails said verification, said at least one processor is operable to decode said received bit sequence by imposing at least one physical constraint during decoding by said decoding algorithm, wherein said physical constraint is related to the type of data for said received bit sequence.

12. The system according to claim 11, wherein said at least one processor is operable to select at least one estimated bit sequence by performing a search starting from each of said selected at least one trellis junction, wherein said at least one estimated bit sequence is selected when verified by a corresponding redundancy verification parameter.

13. The system according to claim 12, wherein said at least one processor is operable to simultaneously generate said corresponding redundancy verification parameter for each of said selected at least one estimated bit sequence and at least one trace back pointer used for performing said search starting from each of said selected at least one trellis junction.

14. The system according to claim 12, wherein said at least one processor is operable to perform at least one physical constraint test on said selected at least one estimated bit sequence.

15. The system according to claim 14, wherein said at least one processor is operable to select one of said selected at least one estimated bit sequence as a decoded output bit sequence based on said performed at least one physical constraint test.

* * * * *